US012266026B2

(12) United States Patent
Itaya

(10) Patent No.: US 12,266,026 B2
(45) Date of Patent: Apr. 1, 2025

(54) FACILITY PLAN EVALUATION DEVICE AND FACILITY PLAN EVALUATION METHOD

(71) Applicant: Mitsubishi Electric Corporation, Tokyo (JP)

(72) Inventor: Nobuhiko Itaya, Tokyo (JP)

(73) Assignee: Mitsubishi Electric Corporation, Tokyo (JP)

( * ) Notice: Subject to any disclaimer, the term of this patent is extended or adjusted under 35 U.S.C. 154(b) by 298 days.

(21) Appl. No.: 17/770,724

(22) PCT Filed: Nov. 22, 2019

(86) PCT No.: PCT/JP2019/045827
§ 371 (c)(1),
(2) Date: Apr. 21, 2022

(87) PCT Pub. No.: WO2021/100200
PCT Pub. Date: May 27, 2021

(65) Prior Publication Data
US 2022/0414799 A1 Dec. 29, 2022

(51) Int. Cl.
*G06Q 50/06* (2024.01)
*G01R 19/165* (2006.01)
(Continued)

(52) U.S. Cl.
CPC ....... *G06Q 50/06* (2013.01); *G01R 19/16571* (2013.01); *G01R 19/1659* (2013.01);
(Continued)

(58) Field of Classification Search
CPC .......................................... G06Q 10/002–90/00
See application file for complete search history.

(56) References Cited

U.S. PATENT DOCUMENTS

| 11,641,118 B2 * | 5/2023 | Kondo | H02J 7/0048 320/136 |
| 2011/0307109 A1 * | 12/2011 | Sri-Jayantha | G06Q 10/04 700/291 |

(Continued)

FOREIGN PATENT DOCUMENTS

| CN | 102377220 A | 3/2012 |
| JP | 2013246541 A | 12/2013 |

(Continued)

OTHER PUBLICATIONS

International Search Report (PCT/ISA/210) with English translation and Written Opinion (PCT/ISA/237) mailed on Feb. 10, 2020, by the Japan Patent Office as the International Searching Authority for International Application No. PCT/JP2019/045827.

(Continued)

*Primary Examiner* — Arif Ullah
(74) *Attorney, Agent, or Firm* — BUCHANAN, INGERSOLL & ROONEY PC

(57) ABSTRACT

A facility plan evaluation device includes a proposed plan receiving unit receiving input of a facility plan including capacities and locations of charging and discharging facilities to be newly arranged in a power system, a prediction unit predicting charge and discharge amounts of the charging and discharging facilities, and demands and power generation amounts of existing facilities, which are facilities already connected in the power system, a power flow calculating unit estimating voltage and current in the power system based on a prediction result of the prediction unit, a determination unit determining whether at least one of deviation of voltage from a proper range and overcurrent occurs based on an estimation result of the power flow calculating unit, and determining whether the facility plan needs to be modified based on a determination result, and a (Continued)

result presenting unit presenting a determination result of the determination unit.

13 Claims, 8 Drawing Sheets

(51) Int. Cl.
    *G01R 22/10*     (2006.01)
    *G06Q 10/0631*     (2023.01)

(52) U.S. Cl.
    CPC ....... *G01R 22/10* (2013.01); *G06Q 10/06312* (2013.01); *G06Q 10/06313* (2013.01)

(56) References Cited

U.S. PATENT DOCUMENTS

| | | | | |
|---|---|---|---|---|
| 2015/0241892 A1* | 8/2015 | Gaucher | ................ | G05F 1/67 |
| | | | | 700/291 |
| 2018/0367320 A1* | 12/2018 | Montalvo | ............. | G05B 15/02 |
| 2019/0202416 A1* | 7/2019 | Lai | ......................... | B60L 53/68 |

FOREIGN PATENT DOCUMENTS

| | | |
|---|---|---|
| JP | 2016046956 A | 4/2016 |
| JP | 2016063548 A | 4/2016 |

OTHER PUBLICATIONS

TW Notice of Rejection issued in corresponding TW Application No. 109139296, dated Jul. 30, 2021.

\* cited by examiner

| CHARGING AND DISCHARGING FACILITY | CONNECTING POSITION | CONTROLLABILITY | CAPACITY | |
|---|---|---|---|---|
| 00001 | R1 | Y | 50 kW | |
| 00002 | R2 | N | 50 kW | |
| ... | | | | |
| | | | | |

FACILITY PLAN INFORMATION No. YYY

EVALUATION RESULT: A (MODIFICATION UNNECESSARY)
NO OVERCURRENT AND NO VOLTAGE VIOLATION
FACILITY PLAN NEED NOT BE CHANGED

FIG.10

```
FACILITY PLAN INFORMATION No. YYY

EVALUATION RESULT: B (MODIFICATION UNNECESSARY
(WITH CONDITIONS))
NO OVERCURRENT AND NO VOLTAGE VIOLATION IF
CONTROLLABLE CHARGING AND DISCHARGING
FACILITIES ARE CONTROLLED
```

FIG.11

```
FACILITY PLAN INFORMATION No. YYY

EVALUATION RESULT: C (MODIFICATION NECESSARY)
CONTROLLABLE CHARGING AND DISCHARGING
FACILITIES NEED TO BE CONTROLLED,
AND CAPACITIES OF FOLLOWING FACILITIES
NEED TO BE CHANGED

FACILITY NUMBER 0001: 50 kW → 30 kW
FACILITY NUMBER 0003: 50 kW → 0 kW

...
```

FACILITY PLAN EVALUATION DEVICE AND FACILITY PLAN EVALUATION METHOD

FIELD

The present invention relates to a facility plan evaluation device and a facility plan evaluation method for evaluating location planning of charging facilities.

BACKGROUND

There have recently been demands for changeover from gasoline (petrol)-powered vehicles or diesel vehicles to electric vehicles as measures against global environmental issues. For this purpose, charging infrastructure for charging electric vehicles needs to be developed. A certain number of fast chargers capable of charging electric vehicles in a short time have already been introduced, but explosive growth in the number of charging facilities to be arranged is expected to expand the use of electric vehicles. Not only electric vehicles but also mobile objects with batteries in general including electric motorcycles and electric aircrafts are also expected to become widespread, and arrangement of charging facilities therefor will be necessary.

In a case where a large number of fast chargers are linked with a power distribution system and a large number of electric vehicles and the like perform charging at the same time, overload or voltage violation can occur in the power system. Overload is a state in which current higher than a proper value flows in the power distribution system, which is also called overcurrent. Voltage violation refers to deviation of a voltage in the power distribution system from a preset proper range. In order to avoid overload and voltage violation, the power distribution system needs to be enhanced, which causes a significant cost. The cost is ultimately imposed on consumers operating charging facilities or widely on all consumers, which will hinder widespread use of charging and discharging facilities and thus widespread use of electric vehicles.

Patent Literature 1 teaches a facility arrangement assisting device that displays both of a power system diagram on which a power margin level indicating the degree of power margin in the power system is superimposed and a map on which geographical accessibility level is superimposed. Use of the facility arrangement assisting device described in Patent Literature 1 allows users to consider the locations of charging facilities for electric vehicles in view of both of the power margin level and the geographical accessibility level. As a result, overload and voltage violation are less likely to occur when charging facilities for electric vehicles are arranged.

CITATION LIST

Patent Literature

Patent Literature 1: Japanese Patent Application Laid-open No. 2013-246541

SUMMARY

Technical Problem

According to the technology of Patent Literature 1, however, a user determines the locations by checking the power margin level and the geographical accessibility level of each charging facility to be arranged. Thus, for considering the location or locations of one or a few charging facilities, a user can obtain appropriate locations by using the technology described in Patent Literature 1. As described above, however, the number of charging facilities is expected to grow rapidly to a very large number, and it is inefficient and unrealistic for a user to select one location at a time by using the technology described in Patent Literature 1. There have therefore been demands for a technology capable of assisting efficient formulation of facility plans including the locations of a large number of charging facilities.

The present invention has been made in view of the above, and an object thereof is to provide a facility plan evaluation device capable of assisting efficient formulation of facility plans including locations of a large number of charging facilities.

Solution to Problem

In order to solve the above-described problems and achieve the object, a facility plan evaluation device according to the present invention includes: an input receiving unit to receive input of a facility plan including capacities and locations of a plurality of charging and discharging facilities to be newly arranged in a power system; and a prediction unit to predict charge and discharge amounts of the charging and discharging facilities, and demands and power generation amounts of existing facilities, the existing facilities being facilities already connected in the power system. The facility plan evaluation device further includes a power flow calculating unit to estimate voltage and current in the power system by power flow calculation on the basis of a prediction result of the prediction unit; a determination unit to determine whether or not at least one of deviation of voltage from a proper range and overcurrent occurs in the power system on the basis of an estimation result of the power flow calculating unit, and determine whether or not the facility plan needs to be modified on the basis of a determination result; and a result presenting unit to present a determination result of the determination unit.

Advantageous Effects of Invention

A facility plan evaluation device according to the present invention produces an effect of enabling assistance in efficient formulation of facility plans including locations of a large number of charging facilities.

BRIEF DESCRIPTION OF DRAWINGS

FIG. 10 is a diagram illustrating an example of display of a determination result when No is determined in step S13.

FIG. 11 is a diagram illustrating an example of display of a determination result when Yes is determined in step S13.

DESCRIPTION OF EMBODIMENTS

A facility plan evaluation device and a facility plan evaluation method according to embodiments of the present invention will be described in detail below with reference to the drawings. Note that the present invention is not limited to the embodiments.

Embodiment

Figure 1:
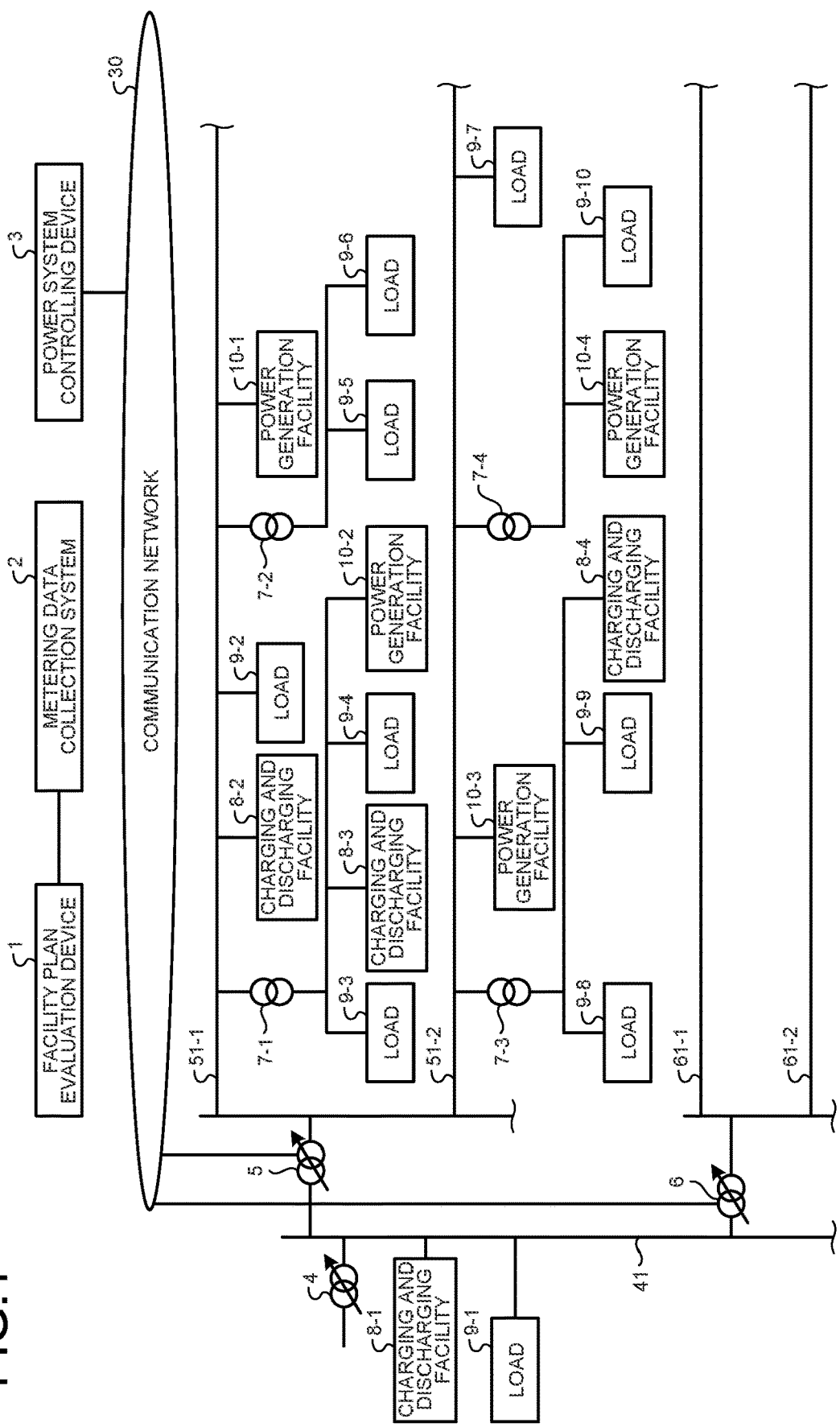
FIG. 1 is a diagram illustrating an example of a configuration of a power system relating to a facility plan to be evaluated by a facility plan evaluation device according to an embodiment of the present invention.

FIG. 1 is a diagram illustrating an example of a configuration of a power system relating to a facility plan to be evaluated by a facility plan evaluation device according to an embodiment of the present invention. A facility plan evaluation device 1 of the present embodiment evaluates a facility plan in a demand area power system as illustrated in FIG. 1, for example. Facility planning includes location planning of charging facilities for charging mobile objects with batteries, such as electric vehicles, electric airplanes, and electric motorcycles. Note that batteries of electric vehicles and the like are rechargeable and dischargeable, and discharged power may reversely flow to the power system. Thus, charging facilities for electric vehicles and the like may be charging and discharging facilities capable of charging and discharging. Charging facilities that provide only charging services for electric vehicles and charging and discharging facilities will be collectively referred to as charging and discharging facilities without being distinguished from each other. In other words, charging and discharging facilities described herein also include charging facilities that only perform charging unless noted otherwise. In addition, charging and discharging facilities in facility planning of the present embodiment are not limited to charging and discharging of mobile objects with batteries, but may also include charging and discharging facilities for stationary batteries, removable charging and discharging equipment, and the like. Removable charging and discharging equipment is used for battery-replaceable mobile objects. Battery replacement indicates that a removable battery mounted on a mobile object such as an electric vehicle is replaced with another charged battery when the remaining battery level of the removable battery gets low. In addition, a stationary battery may be a reused battery that was previously mounted on a mobile object such as an electric vehicle.

The facility plan evaluation device 1 of the present embodiment evaluates a facility plan that is formulated in planning arrangement of new charging and discharging facilities in a demand area power system, which is an example of the power system. The facility plan includes the capacities and the locations of a plurality of charging and discharging facilities to be newly arranged in the power system. FIG. 1 illustrates a state before the new charging and discharging facilities are arranged. The facility plan evaluation device 1 of the present embodiment evaluates the facility plan for newly arranging charging and discharging facilities in the demand area power system illustrated in FIG. 1.

As illustrated in FIG. 1, the demand area power system includes a voltage transformer 4 for converting power at a voltage exceeding 154 kV, which is called ultra-high voltage, transmitted over power lines into power at a voltage called extra-high voltage equal to or lower than 154 kV but higher than 7 kV. The power at the extra-high voltage resulting from the conversion by the voltage transformer 4 is supplied to load ratio control transformers (LRTs; voltage transformers with on-load tap changers) 5 and 6, which are voltage transformers for power distribution, via a power line 41. While two LRTs to which power at an extra-high voltage is supplied from the voltage transformer 4 are illustrated in FIG. 1, the number of LRTs to which power is supplied from the voltage transformer 4 is not limited to two.

The LRTs 5 and 6 each converts the power at the extra-high voltage into power at a voltage higher than 600 V and equal to or lower than 7 kV, which is called high voltage. The voltage on the secondary side of the LRTs 5 and 6 is 6.6 kV, for example. The LRT 5 is connected with distribution lines 51-1 and 51-2. The LRT 6 is connected with distribution lines 61-1 and 61-2. Although not illustrated, switches, voltage controllers, and the like are connected with the distribution lines 51-1, 51-2, 61-1, and 61-2. The voltage controllers are step voltage regulator (SVR), for example, but may include static var compensators (SVC). The voltage controllers need not be provided. While an example in which the LRTs 5 and 6 are each connected with two distribution lines is illustrated in FIG. 1, the number of distribution lines with which each of the LRTs 5 and 6 is connected is not limited to two.

Power is supplied from the power line 41 to facilities of consumers such as factories, large commercial complexes, and large hospitals on the basis of contracts for receiving power at an extra-high voltage. Hereinafter, a consumer that receives power at an extra-high voltage will be referred to as an extra-high voltage consumer. In the example illustrated in FIG. 1, a load 9-1 and a charging and discharging facility 8-1 of an extra-high voltage consumer are connected with the power line 41. Note that a facility of an extra-high voltage consumer may not only receive power supply but also supply power to the power line 41. For example, power discharged by the charging and discharging facility 8-1 may be supplied to the power line 41. Although not illustrated in FIG. 1, a power generation facility of an extra-high voltage consumer may be connected with the power line 41, and generated power may be supplied to the power line 41.

Power is supplied from the distribution lines 51-1, 51-2, 61-1, and 61-2 to facilities of consumers such as factories, commercial complexes, and hospitals on the basis of contracts for receiving power supply at high voltage. Hereinafter, a consumer that receives power at a high voltage will be referred to as a high-voltage consumer. In the example illustrated in FIG. 1, a charging and discharging facility 8-2, a load 9-2, and a power generation facility 10-1 of a high-voltage consumer are connected with the distribution line 51-1. Similarly, a load 9-7 and a power generation facility 10-3 of a high-voltage consumer are connected with the distribution line 51-2. Note that power generated by the power generation facilities 10-1 and 10-3 and power discharged by the charging and discharging facility 8-2 may be supplied to the distribution lines 51-1 and 51-2. Although the illustration is simplified in FIG. 1, a charging and discharging facility may be connected with the distribution line 51-2, and the numbers of loads, charging and discharging facilities, and power generation facilities connected with the distribution lines 51-1 and 51-2 are typically larger than those in the example illustrated in FIG. 1. In addition, although not illustrated, loads, charging and discharging facilities, and power generation facilities are also connected with the distribution lines 61-1 and 61-2.

Voltage transformers 7-1 and 7-2 are connected with the distribution line 51-1, and voltage transformers 7-3 and 7-4 are connected with the distribution line 51-2. The voltage transformers 7-1 to 7-4 are voltage transformers called pole-mounted transformers or on-road transformers, and convert a high-voltage power into a low-voltage power of 100 V or 200 V, for example. Power is supplied from low-voltage distribution lines on the secondary side of the voltage transformers 7-1 to 7-4 to facilities of consumers such as ordinary households, offices, and commercial facilities on the basis of contracts for receiving power supply at low voltage. Hereinafter, a consumer that receives power at a low voltage will be referred to as a low-voltage consumer.

In the example illustrated in FIG. 1, loads 9-3 and 9-4, a charging and discharging facility 8-3, and a power generation facility 10-2 are connected on the secondary side of the voltage transformer 7-1. Loads 9-5 and 9-6 are connected on the secondary side of the voltage transformer 7-2. Loads 9-8 and 9-9 and a charging and discharging facility 8-4 are connected on the secondary side of the voltage transformer 7-3. A load 9-10 and a power generation facility 10-4 are connected on the secondary side of the voltage transformer 7-4. Note that power generated by the power generation facility 10-2 and power discharged by the charging and discharging facility 8-3 may be supplied to the distribution line 51-1 via the voltage transformer 7-1. Similarly, power discharged by the charging and discharging facility 8-4 and power generated by the power generation facility 10-4 may be supplied to the distribution line 51-2 via the voltage transformers 7-3 and 7-4, respectively. The charging and discharging facilities 8-1 to 8-4, the power generation facilities 10-1 to 10-4, and the loads 9-1 to 9-10 illustrated in FIG. 1 are existing facilities that are already connected in the demand area power system.

The number of voltage transformers connected with each of the distribution lines 51-1 and 51-2 is not limited to that in the example illustrated in FIG. 1. The numbers of loads, charging and discharging facilities, and power generation facilities connected with each voltage transformer are not limited to those in the example illustrated in FIG. 1, either. Typically, the number of voltage transformers connected with each of the distribution lines 51-1 and 51-2 is larger than that in the example illustrated in FIG. 1. In addition, although not illustrated, voltage transformers are also connected with the distribution lines 61-1 and 61-2, and loads, charging and discharging facilities, power generation facilities, and the like are connected on the secondary side of the voltage transformers.

Hereinafter, the loads 9-1 to 9-10 will also be referred to as loads 9 when the loads 9-1 to 9-10 are not distinguished from each other, the charging and discharging facilities 8-1 to 8-4 will also be referred to as charging and discharging facilities 8 when the charging and discharging facilities 8-1 to 8-4 are not distinguished from each other, and the power generation facilities 10-1 to 10-4 will also be referred to as power generation facilities 10 when the power generation facilities 10-1 to 10-4 are not distinguished from each other.

In addition, while an example in which a facility plan is formulated for the demand area power system illustrated in FIG. 1 as a unit will be described herein, the unit in which a facility plan is formulated is not limited to a demand area power system. For example, a facility plan may be formulated for a power system of a broader range than that in the example illustrated in FIG. 1, which is connected with a voltage transformer connected on the primary side of the voltage transformer 4, as a unit. Alternatively, a facility plan may be formulated for a range smaller than that in the example illustrated in FIG. 1, such as a power distribution system, as a unit. For example, a facility plan may be formulated for a range including the LRT 5 and the distribution lines 51-1 and 51-2 downstream of the LRT 5 illustrated in FIG. 1 as a unit.

Devices such as voltage controllers, which are not illustrated, connected with the LRTs 5 and 6 and the distribution lines 51-1, 51-2, 61-1, and 61-2 are controlled by a power system controlling device 3. Specifically, the power system controlling device 3 controls respective devices by transmitting control commands to the respective devices via a communication network 30. In a case where measuring devices for measuring voltages, currents, and the like of the distribution lines 51-1, 51-2, 61-1, and 61-2 are arranged on the distribution lines 51-1, 51-2, 61-1, and 61-2, the power system controlling device 3 obtains measurement results from the measuring devices and controls the aforementioned devices by using the obtained measurement results via the communication network 30. While an example in which the power distribution system including the LRT 5 and the power distribution system including the LRT 6 are controlled by one power system controlling device 3 is illustrated in FIG. 1, the power distribution system including the LRT 5 and the power distribution system including the LRT 6 may respectively be controlled by different power system controlling devices.

A metering data collection system 2 collects metering data metered by automatic meter reading devices called smart meters that meter power usages of respective consumers in the demand area power system. The metering data collection system 2 includes a system called a head end system (HES) for controlling communication of smart meters and a system called a metering data management system (MDMS) for managing metering data, for example, but the metering data collection system 2 may have any configuration. The facility plan evaluation device 1 of the present embodiment obtains metering data from the metering data collection system 2, predicts a future state in the demand area power system on the basis of the metering data, and evaluates an input facility plan by using the prediction result. The operation of the facility plan evaluation device 1 will be described later.

Figure 2:
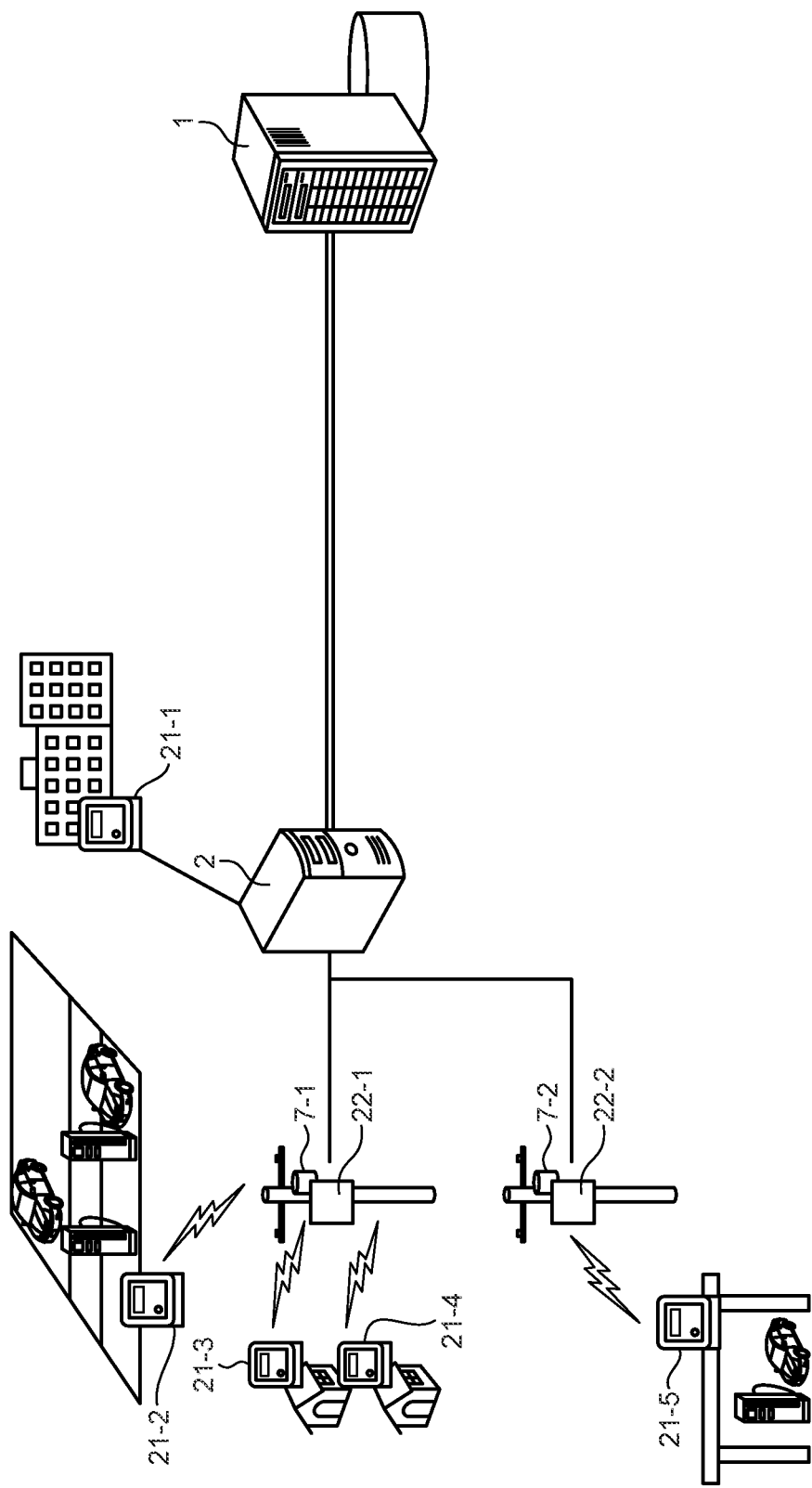
FIG. 2 is a diagram illustrating an example of collection of metering data performed by a metering data collection system of the embodiment.

FIG. 2 is a diagram illustrating an example of collection of metering data performed by the metering data collection system 2 of the present embodiment. The metering data collection system 2 constitutes an automatic meter reading system. The automatic meter reading system includes smart meters 21-1 to 21-5 and concentrators 22-1 and 22-2 as illustrated in FIG. 2, for example. As illustrated in FIG. 2, individual consumers such as ordinary households, hospitals, parking lots, and gas stations are provided with the smart meters 21-1 to 21-5 for metering power usages of the respective consumers. The smart meters 21-1 to 21-5 constitute the automatic meter reading system. The smart meters 21-1 to 21-5 are provided to respective ones of all of extra-high voltage consumers, high-voltage consumers, and low-voltage consumers. Note that the locations of the smart meters 21-1 to 21-5 are schematically illustrated in FIG. 2, and the numbers and the locations of the smart meters are not limited to those in the example illustrated in FIG. 2. Hereinafter, the smart meters 21-1 to 21-5 will also be referred to as smart meters 21 when the smart meters 21-1 to 21-5 are not distinguished from each other. The smart meters 21 each meter a power usage of a consumer every 30 minutes, for example. The smart meter 21 of a consumer having a facility that can cause power to reversely flow to the power system may meter the amount of supply to the power system and the amount of supply from the power system individually, or may meter a difference obtained by subtracting the amount of supply to the power system from the amount of supply from the power system. Facilities that can cause power to reversely flow to the power system are the power generation facilities 10-1 to 10-4 and the charging and discharging facilities 8-1 to 8-4, for example.

As illustrated in FIG. 2, the concentrators 22-1 and 22-2 are mounted on utility poles on which the voltage transformers 7-1 and 7-2 are mounted, respectively. The smart meters 21-2 to 21-5 transmit metering data to the concentrators 22-1 and 22-2, which are master stations, by a multihop wireless communication method. The smart meters 21-2 to 21-5 each transmit metering data to associated one of the concentrators 22-1 and 22-2. The concentrators 22-1 and 22-2 transmit the metering data received from the smart meters 21-2 to 21-5 to the metering data collection system 2. In addition, the smart meter 21-1 transmits metering data to the metering data collection system 2 by power line communication. The communication methods of the smart meters 21-1 to 21-5 illustrated in FIG. 2 are examples, and metering data of the smart meters 21-1 to 21-5 may be collected via a mobile phone network and thus the communication methods of the smart meters 21-1 to 21-5 are not limited to the examples illustrated in FIG. 2.

As described above, charging and discharging facilities for charging and discharging electric vehicles and the like are expected to increase sharply. In order to increase charging and discharging facilities without enhancing the power system, the locations of the charging and discharging facilities that do not cause voltage violation, overload (overcurrent), and the like are considered. When considering the location of one charging and discharging facility, a user can consider the location in view of the margin of the power system; however, when considering the locations of a large number of charging and discharging facilities such as arrangement of charging and discharging facilities in the demand area power system, it is inefficient to consider the locations one by one by a user. It is therefore more efficient to once determine the locations and the capacities of a large number of charging and discharging facilities temporarily as a facility plan, and then determine whether the facility plan is acceptable in terms of stabilization of the power system. Specifically, even if the locations in the facility plan are not optimal in terms of stabilization and convenience of the power system, it is more efficient to adopt the facility plan and proceed with arrangement of charging and discharging facilities if the facility plan is acceptable in terms of stabilization of the power system. The facility plan evaluation device 1 of the present embodiment therefore receives a temporary facility plan set by a user, evaluates whether the facility plan is acceptable in terms of stabilization of the power system, and presents an evaluation result to the user.

Figure 3:
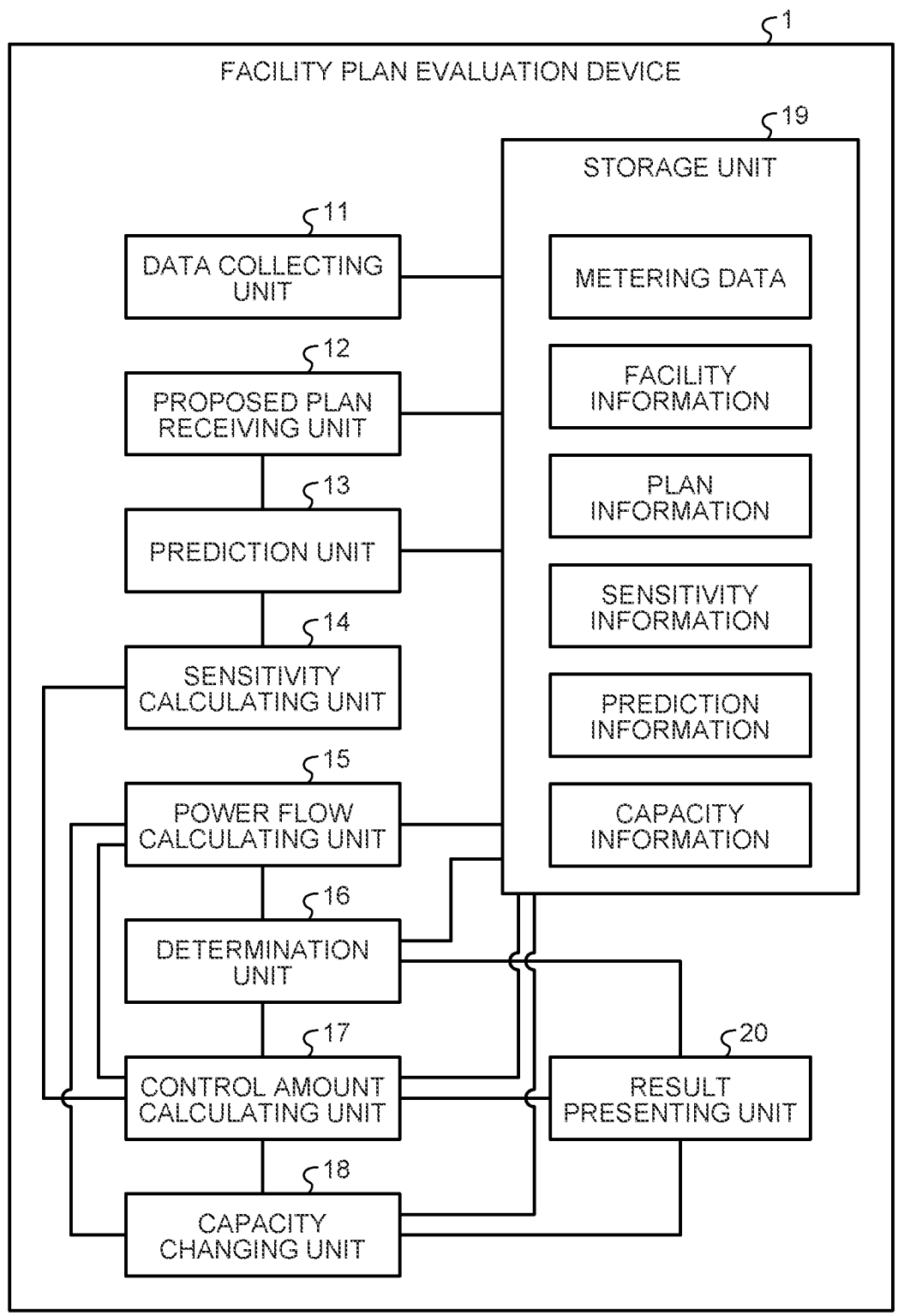
FIG. 3 is a diagram illustrating an example of a configuration of the facility plan evaluation device of the embodiment.

FIG. 3 is a diagram illustrating an example of a configuration of the facility plan evaluation device 1 of the present embodiment. As illustrated in FIG. 3, the facility plan evaluation device 1 of the present embodiment includes a data collecting unit 11, a proposed plan receiving unit 12, a prediction unit 13, a sensitivity calculating unit 14, a power flow calculating unit 15, a determination unit 16, a control amount calculating unit 17, a capacity changing unit 18, a storage unit 19, and a result presenting unit 20.

The data collecting unit 11 obtains metering data from the metering data collection system 2, and stores the metering data in the storage unit 19. The proposed plan receiving unit 12 receives input of a facility plan, and stores the facility plan as plan information in the storage unit 19. The prediction unit 13 predicts charge and discharge amounts of a plurality of charging and discharging facilities included in the facility plan, and demands and power generation amounts of existing facilities, which are facilities already connected in the power system. More specifically, the prediction unit 13 generates prediction curves indicating predicted changes with time of the charge and discharge amounts of charging and discharging facilities to be arranged in a case where facilities according to the plan information are assumed to be arranged on the basis of the plan information and the metering data. In addition, the prediction unit 13 generates prediction curves indicating predicted changes with time of the demands of individual loads in the demand area power system on the basis of the metering data. The prediction unit 13 also generates prediction curves indicating predicted changes with time of the power generation amounts of individual power generation facilities in the demand area power system on the basis of the metering data. The prediction unit 13 aggregates the prediction curves in units of predetermined sections, and stores the aggregated prediction curves as prediction information in the storage unit 19.

The sensitivity calculating unit 14 calculates the sensitivities of voltages and currents of controllable charging and discharging facilities and normal charging and discharging facilities by using results of power flow calculation performed by the power flow calculating unit 15 that can be obtained by changing inputs to the power flow calculating unit 15, which will be described later, and stores calculation results as sensitivity information in the storage unit 19. The power flow calculating unit 15 performs power flow calculation for sensitivity calculation on the basis of facility information, the prediction information, and values input by the sensitivity calculating unit 14, and outputs results of the power flow calculation to the sensitivity calculating unit 14. The facility information is information necessary for power flow calculation and relating to individual existing facilities in the demand area power system, and is stored in advance in the storage unit 19. The facility information includes connection positions and the like of the voltage transformers 7-1 to 7-4, facilities of individual consumers, voltage controllers, and the like, for example. The power flow calculating unit 15 also estimates voltages and currents in the demand area power system by power flow calculation on the basis of the prediction results from the prediction unit, that is, the prediction information, and outputs estimation results to the determination unit 16. The determination unit 16 determines whether or not at least one of voltage violation and overcurrent occurs on the basis of the results of power flow calculation, that is, the estimation results from the power flow calculating unit 15. The determination unit 16 determines whether or not the facility plan needs to be modified on the basis of the determination result.

When the determination unit 16 determines that at least either one of voltage violation and overcurrent has occurred, the control amount calculating unit 17 determines control amounts for first charging and discharging facilities, which are controllable charging and discharging facilities, among the existing charging and discharging facilities 8 and a plurality of charging and discharging facilities planned to be arranged in the facility plan. The control amounts may be determined in units of aggregation described above or for each charging and discharging facility. The controllable charging and discharging facilities are charging and discharging facilities for which control of charge and discharge amounts, power factors, and the like is determined to be performed by request from a power company that manages the power system, or the like, by contracts between a power company and consumers that manage the charging and discharging facilities. Among a plurality of charging and discharging facilities that are planned to be arranged in a facility plan, charging and discharging facilities other than those that are controllable are normal charging and discharging facilities for which control by request from the power system is not performed, and are also referred to as second charging and discharging facilities. For an existing charging and discharging facility 8, the facility information includes information indicating whether or not the charging and discharging facility 8 is a controllable charging and discharging facility. For the charging and discharging facilities 8 and charging and discharging facilities that are planned to be arranged in the facility plan, the facility plan includes information indicating whether or not the charging and discharging facilities are controllable charging and discharging facilities. In addition, for a controllable charging and discharging facility, a controllable amount curve indicating a controllable amount in each time zone is set in advance, and the control amount calculating unit 17 calculates a control amount within the range of the controllable amount curve. When a control amount within the range of the controllable amount curve cannot be calculated, that is, when at least either one of voltage violation and overcurrent cannot be resolved even by maximum possible control within the range of the controllable amount curve, the control amount calculating unit 17 determines that the control amount cannot be calculated. When voltage violation and overcurrent can be prevented by control within the range of the controllable amount curve, the control amount calculating unit 17 determines that the control amount can be calculated. Hereinafter, charging and discharging facilities other than those that are controllable will be referred to as normal charging and discharging facilities.

When at least either one of voltage violation and overcurrent cannot be resolved by the control amount within the range of the controllable amount curve of a controllable charging and discharging facility, the capacity changing unit 18 changes the capacity of a normal charging and discharging facility so that the voltage violation or overcurrent can be resolved. The capacity changing unit 18 stores the changed capacity and the change amount as capacity information. The result presenting unit 20 presents the determination result from the determination unit 16 to the user. The result presenting unit 20 also presents the change results and the like from the capacity changing unit 18 to the user. Details of the operations of the respective units of the facility plan evaluation device 1 will be described later.

Figure 4:
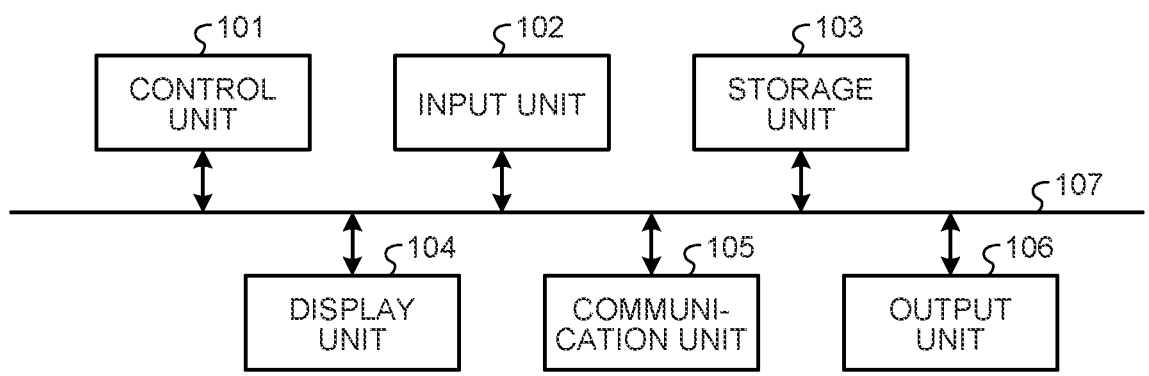
FIG. 4 is a diagram illustrating an example of a configuration of a computing system according to the embodiment.

Next, a hardware configuration of the facility plan evaluation device 1 will be described. The facility plan evaluation device 1 of the present embodiment is, specifically, a computing system, that is, a computer. The computing system functions as the facility plan evaluation device 1 by execution of facility plan evaluation programs on the computing system. FIG. 4 is a diagram illustrating an example of a configuration of the computing system according to the present embodiment. As illustrated in FIG. 4, the computing system includes a control unit 101, an input unit 102, a storage unit 103, a display unit 104, a communication unit 105, and an output unit 106, which are connected with each other via a system bus 107.

In FIG. 4, the control unit 101 is a processor such as a central processing unit (CPU), and executes the facility plan evaluation programs of the present embodiment. The input unit 102 is constituted by a keyboard, a mouse, and the like, for example, and used by a user of the computing system to input various information. The storage unit 103 includes various kinds of memories such as a random access memory (RAM) and a read only memory (ROM) and a storage device such as a hard disk, and stores programs to be executed by the control unit 101, necessary data obtained in the process of processing, and the like. In addition, the storage unit 103 is also used as a temporary storage area of programs. The display unit 104 is constituted by a display, a liquid crystal display (LCD) panel or the like, and displays various screens for the user of the computing system. The communication unit 105 is a transmitter and receiver that perform communication processes. Note that FIG. 4 is an example, and the configuration of the computing system is not limited to the example of FIG. 4.

Here, an example of operation of the computing system until the facility plan evaluation programs of the present embodiment become an executable state will be explained. In the computing system having the above-described configuration, the facility plan evaluation programs are installed in the storage unit 103 from a compact disc (CD)-ROM or digital versatile disc (DVD)-ROM set in a CD-ROM drive or a DVD-ROM drive, which is not illustrated, for example. In execution of the facility plan evaluation programs, the facility plan evaluation programs read from the storage unit 103 are stored in a predetermined area in the storage unit 103. In this state, the control unit 101 performs a facility plan evaluation process of the present embodiment in accordance with the programs stored in the storage unit 103.

While the programs describing the facility plan evaluation process are provided with use of the CD-ROM or the DVD-ROM as a recording medium in the present embodiment, this is not a limitation, and the programs may be provided via a transmission medium such as the Internet via the communication unit 105, for example, depending on the configuration of the computing system and the capacity of the provided programs.

The data collecting unit 11 illustrated in FIG. 3 is implemented by the control unit 101 and the communication unit 105 in FIG. 4. The storage unit 19 illustrated in FIG. 3 is part of the storage unit 103 illustrated in FIG. 4. The proposed plan receiving unit 12 illustrated in FIG. 3 is implemented by the input unit 102 and the control unit 101. In a case where the proposed plan receiving unit 12 receives a facility plan from an external device through communication, the proposed plan receiving unit 12 is implemented by the communication unit 105 and the control unit 101. The prediction unit 13, the sensitivity calculating unit 14, the power flow calculating unit 15, the determination unit 16, the control amount calculating unit 17, the capacity changing unit 18, and the result presenting unit 20 illustrated in FIG. 3 are implemented by the control unit 101.

Figure 5:
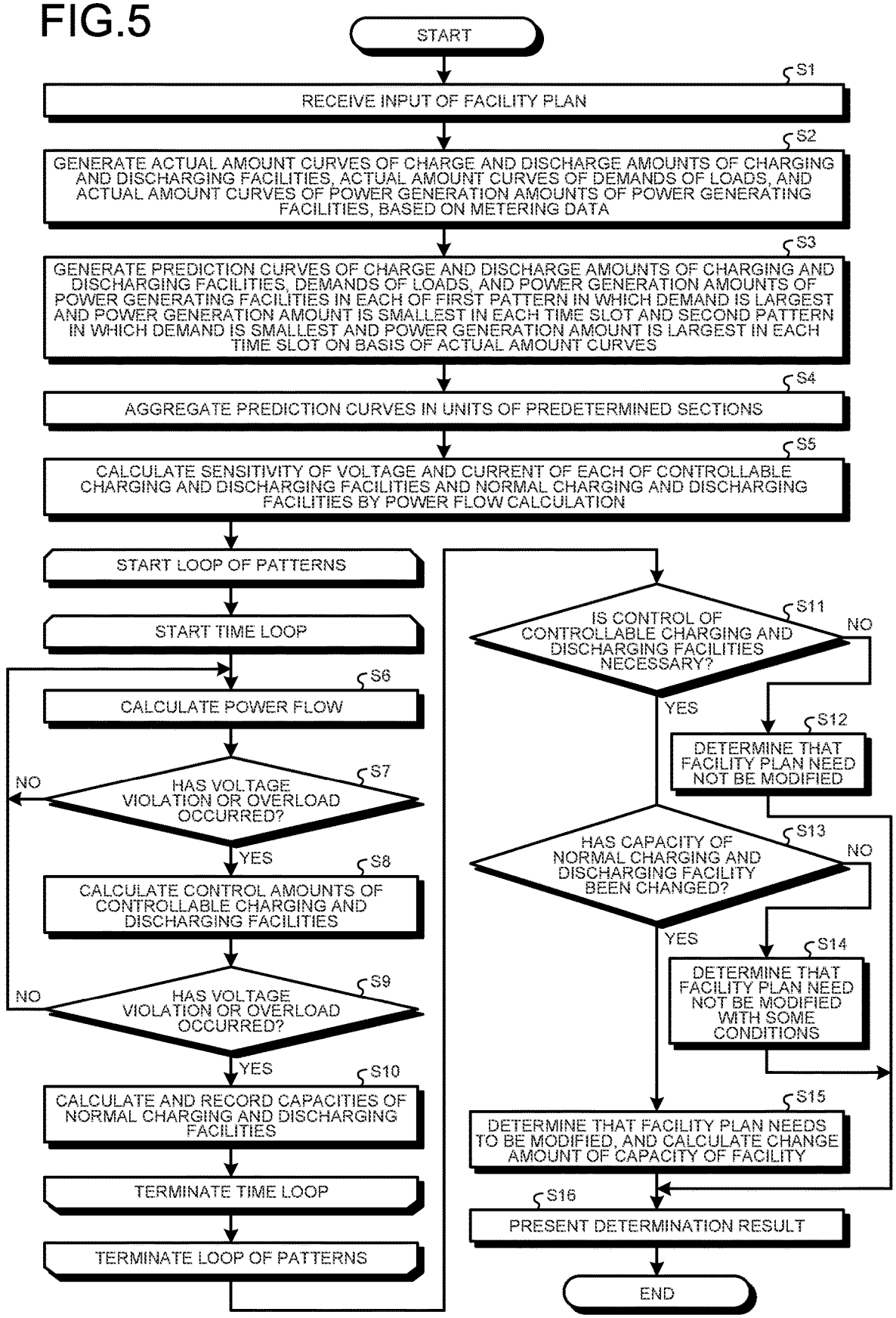
FIG. 5 is a flowchart illustrating an example of procedures of a facility plan evaluation process performed by the facility plan evaluation device of the embodiment.

Next, the operation of the facility plan evaluation device 1 of the present embodiment will be explained. FIG. 5 is a flowchart illustrating an example of procedures of a facility plan evaluation process performed by the facility plan evaluation device 1 of the present embodiment. As illustrated in FIG. 5, the proposed plan receiving unit 12 receives input of a facility plan (step S1). The facility plan received in this process is a temporary facility plan as described above in which the user assumes that charging and discharging facilities are to be arranged at all the positions at which charging and discharging facilities are likely to be arranged, for example. Specifically, the facility plan is a plan for arranging charging and discharging facilities at all ordinary households, all parking lots, all gas stations, and all convenience stores connected in the demand area power system, for example. The capacity, that is, the maximum charging power and the maximum discharging power of each of the charging and discharging facilities in a facility plan can be set to any values. If a location at which a charging and discharging facility is already arranged is present among all the positions described above, the location is removed from the facility plan. The information on existing charging and discharging facilities is included in the facility information as described above.

A facility plan may be directly input to the proposed plan receiving unit 12 by a user, or it may be created on another device by a user and the proposed plan receiving unit 12 may receive the facility plan from the device. In addition, for example, consumers may be classified into ordinary households, parking lots, gas stations, convenience stores, and the like on the basis of contract information on the consumers or the like, and a facility plan may be created such that charging and discharging facilities are automatically arranged at all the positions of consumers of a target type on the basis of the classification result and the positions of the consumers in the system. In addition, in a facility plan, a plurality of types of charging and discharging facilities may be set as the charging and discharging facilities. For example, a plurality of types of charging and discharging facilities are fast charging and discharging facilities, normal charging and discharging facilities, removable charging and discharging facilities, and the like. In this case, a maximum value of the charge amount and a maximum value of the discharge amount may be determined for each type.

Figure 6:
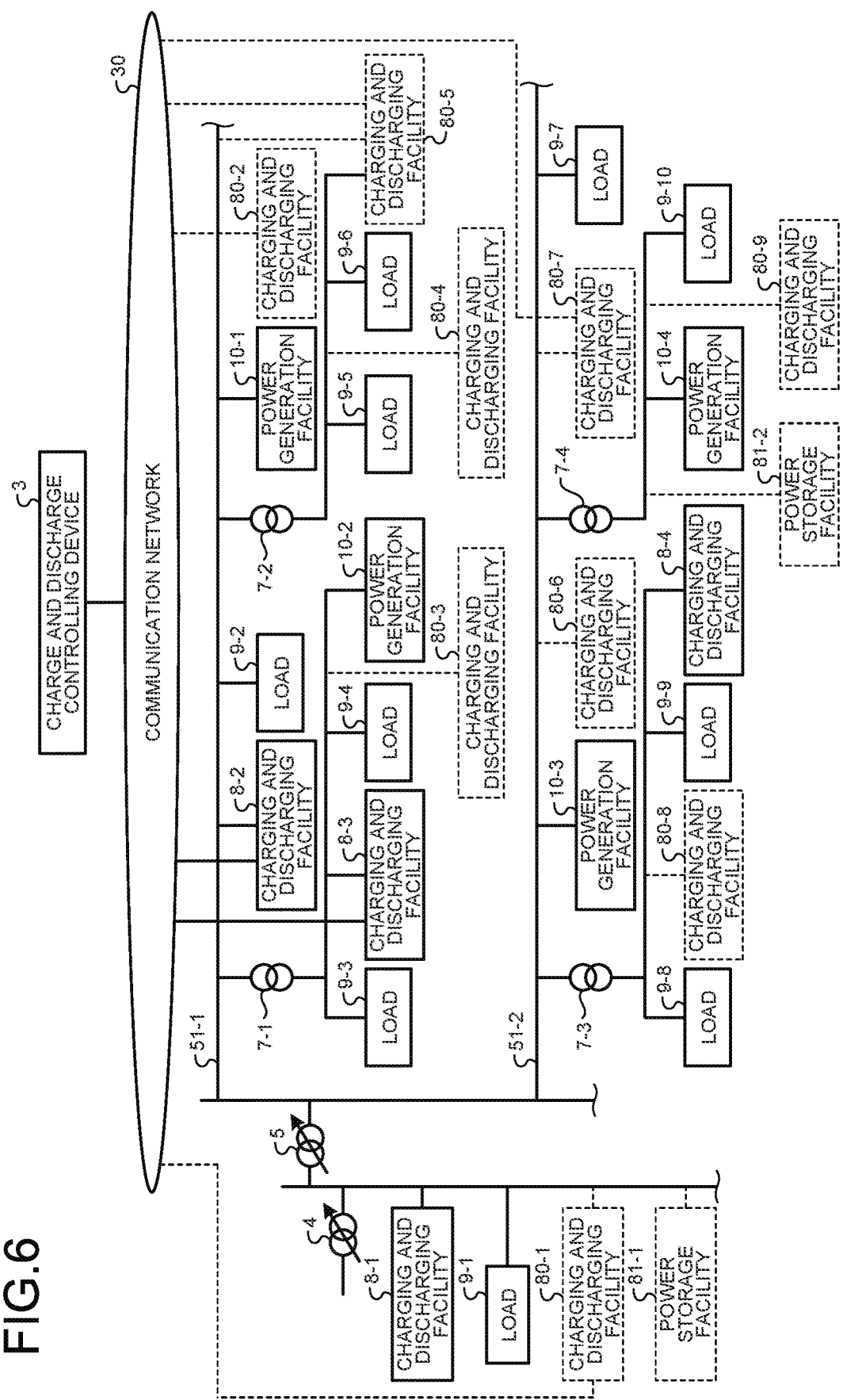
FIG. 6 is a diagram illustrating an example of locations of facilities indicated in a facility plan of the embodiment.

FIG. 6 is a diagram illustrating an example of locations of facilities indicated in a facility plan of the present embodiment. FIG. 6 illustrates a facility plan for adding charging and discharging facilities 80-1 to 80-9 and power storage facilities 81-1 and 81-2, which are illustrated by dashed lines, to the existing facilities illustrated in FIG. 1. Note that, herein, the charging and discharging facilities 80-1 to 80-9 are equipment for charging and discharging of mobile objects such as electric vehicles, and the power storage facilities 81-1 and 81-2 are stationary batteries. The power storage facilities 81-1 and 81-2 can perform discharging in addition to power storage, and are thus included in charging and discharging facilities in the present embodiment. Hereinafter, charging and discharging facilities included in the facility plan also include the power storage facilities 81-1 and 81-2. As illustrated in FIG. 6, charging and discharging facilities assumed to be arranged in a facility plan may be connected to any of an extra-high voltage system, a high-voltage system, and a low-voltage system. The numbers and the connecting positions of the charging and discharging facilities 80-1 to 80-9 and the power storage facilities 81-1 and 81-2 illustrated in FIG. 6 are examples, and the numbers and the connecting positions of the charging and discharging facilities 80-1 to 80-9 and the power storage facilities 81-1 and 81-2 are not limited to those in the example illustrated in FIG. 6.

Among the charging and discharging facilities 80-1 to 80-9, the charging and discharging facilities 80-1, 80-2, 80-5, and 80-7 are connected with the power system controlling device 3 via the communication network 30 as illustrated by dashed lines. This means that the charging and discharging facilities 80-1, 80-2, 80-5, and 80-7 can control charging and discharging in accordance with control commands from the power system controlling device 3. Thus, the charging and discharging facilities 80-1, 80-2, 80-5, and 80-7 are controllable charging and discharging facilities. The charging and discharging facilities 80-3, 80-4, 80-6, 80-8, and 80-9 that are not connected with the power system controlling device 3 are normal charging and discharging facilities that cannot be controlled by the power system controlling device 3. Some of the existing charging and discharging facilities 8 are also connected with the power system controlling device 3. This means that the power system controlling device 3 does not have the function of controlling the charging and discharging facilities 8 at present, but the function will be added in the future and some of the existing charging and discharging facilities 8 will also be controllable charging and discharging facilities to be controlled by the power system controlling device 3. Information on whether or not an existing charging and discharging facility 8 is a controllable charging and discharging facility may be included in facility information if already defined in a contract or the like, or may be newly defined in a facility plan. Alternatively, all of the existing charging and discharging facilities 8 may be normal charging and discharging facilities.

Figures 7, 8, 9:
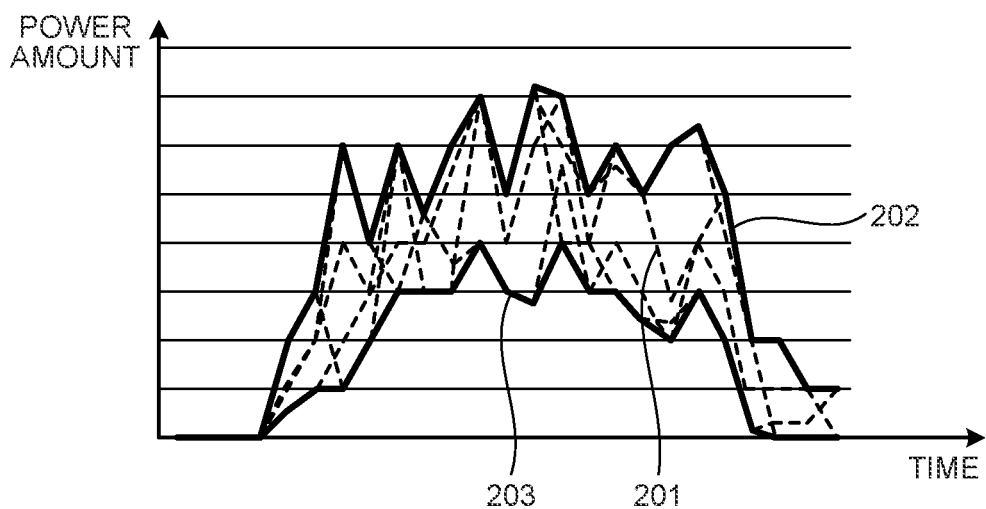
FIG. 7 is a table illustrating an example of a facility plan of the embodiment.
FIG. 8 is a graph for explaining largest demands and smallest demands in the embodiment.
FIG. 9 is a diagram illustrating an example of display when No is determined in step S11.

FIG. 7 is a table illustrating an example of a facility plan of the present embodiment. As illustrated in FIG. 7, a facility plan includes the identification information, the connecting position, the controllability, and the capacity of each charging and discharging facility. The capacity is a maximum charging power and a maximum discharging power. In the example illustrated in FIG. 7, both of the maximum charging power and the maximum value of the discharge amount of each of the charging and discharging facilities on two rows from the top are 50 kW, but the maximum charging power and the maximum value of the discharge amount may be different from each other. In addition, the connecting position of each charging and discharging facility is indicated by the length or the impedance of the power line 41 from the voltage transformer 4 when the charging and discharging facility is connected with a power line in an extra-high voltage system, or by the associated LRT and the length or the impedance of the distribution line from the LRT when the charging and discharging facility is connected with any of the distribution lines 51-1, 51-2, 61-1, and 61-2. In addition, the connecting position of each charging and discharging facility is indicated by the associated voltage transformer 7 when the charging and discharging facility is connected with a distribution line in a low-voltage system. Alternatively, the connecting position of each charging and discharging facility is indicated by the associated voltage transformer 7 and the length or the impedance of the distribution line from the voltage transformer 7. In addition, the controllability is information indicating whether each charging and discharging facility is a controllable charging and discharging facility or a normal charging and discharging facility as described above. Herein, for a controllable charging and discharging facility, the charge amount (charging power) and the discharge amount (discharging power) can be controlled, and the power factor can also be controlled, in accordance with a request from the power system. In a case where a charging and discharging facility for which the charge amount and the discharge amount can be controlled but the power factor cannot be controlled is present, the field of controllability is divided into the controllability of charge and discharge amounts and the controllability of the power factor.

The description refers back to FIG. 5. Subsequently, the prediction unit 13 generates actual amount curves of the charge and discharge amounts of the charging and discharging facilities, actual amount curves of the demands of the loads, and actual amount curves of the power generation amounts of the power generation facilities on the basis of the metering data (step S2). More specifically, for example, the prediction unit 13 generates the charge and discharge amounts of each charging and discharging facility per unit time in a predetermined period as an actual amount curve of the charge and discharge amounts. The predetermined period is one year, for example, and the unit time is 30 minutes, for example, but the predetermined period and the unit time are not limited to these values. In addition, instead of a continuous period, the predetermined period may be one day per month, i.e., a total of twelve days, or one day per season, i.e., a total of four days, for example.

The actual amount curves generated in step S2 relate to existing facilities. Thus, the actual amount curves of the charge and discharge amounts of the charging and discharging facilities are the actual amount curves of the charge and discharge amounts of the charging and discharging facilities 8-1 to 8-4 in the examples illustrated in FIGS. 1 and 6. Note that the charge and discharge amounts of each charging and discharging facility 8 can be obtained from the metering data if the smart meters 21 are provided specially for the charging and discharging facilities 8, but the smart meters 21 are typically installed for respective consumers. The metering data may thus indicate power amounts of mixture of the charge and discharge amounts of the charging and discharging facilities, the demands of the consumer loads, and the like. In such a case, for example, an average of the demands of a consumer having only loads is calculated, the consumer being the same type as a first consumer having charge and discharge amounts and loads, and a difference between the metering data associated with the first consumer and the calculated average is assumed to be the charge and discharge amounts. The same type of consumer may be defined in any manner; consumers are classified by types such as ordinary households, commercial facilities, factories, and hospitals, for example. In addition, commercial facilities and factories may further be classified into business categories. The method for separating the charge and discharge amounts from the demands of the loads is not limited, and any method may be used therefor.

Subsequently, the prediction unit 13 generates prediction curves of the charge and discharge amounts of the charging and discharging facilities, the demands of the loads, and the power generation amounts of the power generation facilities in each of a first pattern in which the demand is largest and the power generation amount is smallest in each time slot and a second pattern in which the demand is smallest and the power generation amount is largest in each time slot, on the basis of the actual amount curves (step S3). The prediction unit 13 stores the generated prediction curves as prediction information in the storage unit 19.

The case where the demand is largest is a case where the prediction value of the demand in each time zone is largest. For example, a prediction value in each time zone can be predicted on the basis of the metering data. In this case, a prediction curve of the demands in a case of the largest demands can be obtained as the largest values of the demands in respective time zones, that is, respective time slots when the metering data of the demands of a load 9 are superimposed in each time zone of a day for a year. Similarly, the case where the demand is smallest is a case where the prediction value of the demand in each time zone is smallest. FIG. 8 is a graph for explaining the largest demands and the smallest demands in the present embodiment. Actual amount curves 201 represented by a plurality of dashed curves in FIG. 8 are illustrated by superimposing demands indicated by the metering data of a load 9 within a predetermined period in each time zone of a day. The vertical axis represents demands, that is, power amounts, and the horizontal axis represents time, that is, time zones in 24 hours. While one dashed curve is denoted by the reference numeral 201 in FIG. 8, the other dashed curves also represent actual amount data of the demands of the same load 9 on other days in a similar manner. For example, the actual amount curves 201 represent the metering data during one day on the first of October, the metering data during one day on the second of October, the metering data during one day on the third of October, and the metering data during one day on the fourth of October in a certain year. A curve that indicates the largest values in respective time slots of such actual amount curves 201 obtained for a predetermined period is a largest demand curve 202. Similarly, a curve that indicates the smallest values in the respective time slots is a smallest demand curve 203. While four actual amount curves 201 are illustrated for simplification of the graph in FIG. 8, actual amount curves for a predetermined period are used in practice. Note that, because the actual amount curves 201 and the like are discretized per unit time in practice, the lines obtained by connecting the points as illustrated in FIG. 8 are not actually curves; however, the lines are referred to as curves because they indicate changes.

In the case of power generation amounts, in a manner similar to demands, the largest power generation amount curve can be calculated by obtaining the largest values of power generation amounts of a power generation facility 10 in respective time slots, and the smallest power generation amount curve can be calculated by obtaining the smallest values of the power generation amounts in the respective time slots. For the charge and discharge amounts, the prediction unit 13 obtains a curve indicating the largest values of the charge amounts of a charging and discharging facility 8 in respective time slots, and a curve indicating the largest values of the discharge amounts of the charging and discharging facility 8 in the respective time slots.

The prediction unit 13 generates the prediction curves of the charge and discharge amounts of the charging and discharging facilities, the demands of the loads, and the power generation amounts of the power generation facilities in the first pattern by using these results. Specifically, the prediction unit 13 calculates, as first prediction information, prediction values of the largest values of the charge amounts of a plurality of charging and discharging facilities included in a facility plan, prediction values of the largest values of the demands of the existing facilities, and prediction values of the smallest values of the power generation amounts of the existing facilities in respective time zones. The prediction unit 13 may use the largest demand curve 202 illustrated in FIG. 8 as a prediction curve of the demands of the loads in the first pattern, or a curve obtained by decreasing the demands of the largest demand curve 202 on the assumption that there will be progress in energy conservation measures in the future as a prediction curve of the demands in the first pattern. Conversely, the prediction unit 13 may use a curve obtained by increasing the demands of the largest demand curve 202 in view of errors as a prediction curve of the demands in the first pattern. Similarly, the prediction unit 13 may use the smallest power generation amount curve calculated from the actual amount values of the power generation amounts as a prediction curve of the power generation amounts in the first pattern, or a curve obtained by increasing or decreasing the power generation amounts of the smallest power generation amount curve as a prediction curve of the power generation amounts in the first pattern.

Similarly, the prediction unit 13 generates the prediction curves of the demands of the loads and the power generation amounts of the power generation facilities in the second pattern by using the smallest power generation amount curve and the largest demand curve. Specifically, the prediction unit 13 calculates, as second prediction information, prediction values of the largest values of the discharge amounts of a plurality of charging and the discharging facilities included in the facility plan, prediction values of the smallest values of the demands of the existing facilities, and prediction values of the largest values of the power generation amounts of the existing facilities in the respective time zones. In addition, for the existing charging and discharging facilities 8, the prediction unit 13 generates a prediction curve of the charge and discharge amounts in the first pattern on the basis of the curve indicating the largest values of the charge amounts in the respective time slots. In addition, for the existing charging and discharging facilities 8, the prediction unit 13 generates a prediction curve of the charge and discharge amounts in the second pattern on the basis of the curve indicating the largest values of the discharge amounts in the respective time slots. Furthermore, the prediction unit 13 generates prediction curves of the charge and discharge amounts, in the first pattern, of the charging and discharging facilities planned to be arranged in the facility plan by using the prediction curves of the charge and discharge amounts of the existing charging and discharging facilities 8 in the first pattern. For example, the prediction unit 13 obtains, as a prediction curve of the charge and discharge amounts of a first charging and discharging facility that is a charging and discharging facility planned to be arranged in a facility plan, average values of the prediction curves of the charge and discharge amounts, in the first pattern, of an existing charging and discharging facility 8 of a consumer having capacity equivalent to that of the first charging and discharging facility, the consumer being the same type of consumer as a consumer having the first charging and discharging facility. Alternatively, the prediction unit 13 may obtain, as a prediction curve of the charge and discharge amounts of a first charging and discharging facility that is a charging and discharging facility planned to be arranged in a facility plan, the largest values in respective time slots of the prediction curves of the charge and discharge amounts, in the first pattern, of an existing charging and discharging facility 8 of a consumer having capacity equivalent to that of the first charging and discharging facility, the consumer being the same type of consumer as a consumer having the first charging and discharging facility. Similarly, the prediction unit 13 generates prediction curves of the charge and discharge amounts, in the second pattern, of the charging and discharging facilities planned to be arranged in the facility plan by using the prediction curves of the charge and discharge amounts of the existing charging and discharging facilities 8 in the second pattern.

The method for generating prediction curves described above is an example, and the prediction unit 13 only needs to generate prediction curves by predicting the charge and discharge amounts of a plurality of charging and discharging facilities included in a facility plan, and the demands and the power generation amounts of the existing facilities, which is not limited to the method using previous metering data. Note that the demands of the existing facilities in this case also include the demands resulting from charging of the charging and discharging facilities 8 illustrated in FIG. 1, and the power generation amounts of the existing facilities also include the discharge amounts resulting from discharging of the charging and discharging facilities 8.

The description refers back to FIG. 5. After step S3, the prediction unit 13 aggregates the prediction curves in units of predetermined sections (step S4). The predetermined sections are in units of voltage transformers 7, for example, but may be power distributing sections or other units. In step S4, the prediction unit 13 calculates, as aggregated prediction curves, prediction curves of the charge and discharge amounts, the power generation amounts, and the demands at representative points in the sections such that the facilities connected in the respective sections are equivalent to those connected with the representative points. Note that, in this case, for the charge and discharge amounts of the charging and discharging facilities, the aggregation is performed separately for controllable charging and discharging facilities and normal charging and discharging facilities. Thus, four aggregated prediction curves of the charge and discharge amounts of controllable charging and discharging facilities, the charge and discharge amounts of normal charging and discharging facilities, the power generation amounts, and the demands are obtained in units of sections in each of the first pattern and the second pattern. For facilities connected in an extra-high voltage system, the aggregation may be performed in any section of the power line 41, or the prediction curves need not be aggregated. The prediction unit 13 stores the aggregated prediction curves as prediction information in the storage unit 19. Note that the aggregation in units of sections need not be performed. In a case where the aggregation is not performed, subsequent processes may each be performed by using the prediction curves of the individual facilities.

Subsequently, the sensitivity calculating unit 14 performs sensitivity calculation of the voltages and the currents of controllable charging and discharging facilities and normal charging and discharging facilities by power flow calculation (step S5). More specifically, the sensitivity calculating unit 14 first instructs the power flow calculating unit 15 to perform power flow calculation on the basis of the aggregated prediction curves in the first pattern obtained in step S4, and the power flow calculating unit 15 performs the power flow calculation in accordance with the instruction. Any method including the Newton-Raphson method and the Fast Decoupled Load Flow method can be used for a specific method of the power flow calculation performed by the power flow calculating unit 15. The voltage and the current of each of nodes on the power lines and the distribution lines in the demand area power system in each time slot are calculated by power flow calculation performed by the power flow calculating unit 15. The obtained voltage and current of each node in each time slot are used as reference voltage and reference current, respectively.

Subsequently, the sensitivity calculating unit 14 changes the active power of charging and discharge by a unit amount such as 1 kW, for example, by using the aggregated prediction curves of the controllable charging and discharging facilities in units of sections, and causes the power flow calculating unit 15 to perform power flow calculation in a similar manner. The sensitivity calculating unit 14 calculates a difference between a current obtained by the power flow calculation with the changed charge and discharge amounts and the reference current as current sensitivity to each of the nodes of controllable charging and discharging facilities in each section. Similarly, the sensitivity calculating unit 14 subsequently changes the reactive power of charge and discharge amounts by a unit amount such as 1 kVar, for example, by using the aggregated prediction curves of the controllable charging and discharging facilities in units of sections, and causes the power flow calculating unit 15 to perform power flow calculation in a similar manner. The sensitivity calculating unit 14 calculates a difference between a voltage obtained by the power flow calculation with the changed charge and discharge amounts and the reference voltage as voltage sensitivity to each of the nodes of controllable charging and discharging facilities in each section. Similarly, the sensitivity calculating unit 14 calculates the voltage sensitivity and the current sensitivity to each of the nodes of normal charging and discharging facilities in each section. Note that, because the reactive power cannot be changed for normal charging and discharging facilities, a difference between a voltage obtained as a result of power flow calculation when the charging power is changed by 1 kW and the reference voltage is calculated as voltage sensitivity to each of the nodes of controllable charging and discharging facilities in each section. The sensitivity calculating unit 14 stores the calculated voltage sensitivities and current sensitivities of the controllable charging and discharging facilities and the normal charging and discharging facilities as sensitivity information in the storage unit 19. Note that the sensitivity calculating unit 14 performs the sensitivity calculation in each of the first pattern and the second pattern.

After step S5, a loop of patterns is started. The patterns here are the first pattern and the second pattern described above. Thus, a process in the first pattern is performed in the first loop, and a process in the second pattern is performed in the second loop. After the loop of patterns is started, a time loop is started. The time loop is a loop per unit time, and repeated every 30 minutes for one day, for example.

After the time loop is started, the facility plan evaluation device 1 first performs power flow calculation (step S6). In step S6, more specifically, the power flow calculating unit 15 first performs power flow calculation by using the aggregated prediction curves described above. The determination unit 16 determines whether or not a node at which voltage violation or overload occurs is present on the basis of the power flow calculation. A threshold of current for determining whether or not overload has occurred and a proper voltage range for determining voltage violation are set for each section, and stored as facility information in the storage unit 19, for example. Hereinafter, voltage violation and overload may collectively be referred to as violation. When voltage violation or overload occurs, the determination unit 16 instructs the power flow calculating unit 15 to simulate the control of the LRTs 5 and 6 and the voltage controllers that are not illustrated in FIG. 1, and perform power flow calculation again. The power flow calculating unit 15 simulates the control of the LRTs 5 and 6 and the voltage controllers that are not illustrated in FIG. 1, and then performs power flow calculation again. The controllable ranges of the LRTs 5 and 6 and the voltage controllers are preset. Any method can be applied to the method for simulating the control amounts of the LRTs 5 and 6 and the voltage controllers. Note that, when a node at which voltage violation or overload occurs is present as a result of performing power flow calculation again, changing the control amounts of the LRTs 5 and 6 and the voltage controllers again and performing power flow calculation may be repeated within a controllable range of the LRTs 5 and 6 and the voltage controllers.

Subsequently, the determination unit 16 determines whether or not voltage violation or overload has occurred (step S7). As described above, in step S6, the control of the LRTs 5 and 6 and the voltage controllers may be simulated. Thus, when the control of the LRTs 5 and 6 and the voltage controllers is simulated, the result of power flow calculation to be determined in step S7 is a result of power flow calculation after the control of the LRTs 5 and 6 and the voltage controllers is simulated.

When voltage violation or overload is determined to have occurred (step S7: Yes), the facility plan evaluation device 1 calculates the control amounts of the controllable charging and discharging facilities, and performs power flow calculation again (step S8). More specifically, upon determining that voltage violation or overload has occurred, the determination unit 16 informs the control amount calculating unit 17 of the determination result. The determination result includes information indicating the type of the violation, a node at which the violation has occurred, and a violation amount. The violation amount is a difference between the current of the node at which the violation has occurred and a threshold in the case of overload, or a deviation amount of the voltage of the node at which the violation has occurred from an upper limit or a lower limit of the proper range in the case of voltage violation. In the case of voltage violation, information on whether the voltage exceeds the upper limit or is lower than the lower limit is added to the violation amount. For example, whether the voltage exceeds the upper limit or is lower than the lower limit is indicated by a plus or minus sign of the violation amount.

The control amount calculating unit 17 calculates the control amounts for the controllable charging and discharging facilities on the basis of the determination results provided from the determination unit 16. For example, when a node at which overload is determined to have occurred is present, change amounts of charge and discharge amounts aggregated in each section are calculated by using the violation amount and the current sensitivities of controllable charging and discharging facilities. As described above, because the current sensitivity represents the amount of change in the current of each node when the aggregated charge and discharge amounts are changed by 1 kW, the amount of change in the active power of aggregated charging and discharging facilities in each section for changing the current of a node at which overload is determined to have occurred by the violation amount can be obtained as a control amount. Note that the determination of the control amounts may be performed in units of aggregation described above or for each charging and discharging facility. In a case where the control amounts are determined for each charging and discharging facility, the facility plan evaluation device 1 performs sensitivity calculation for each charging and discharging facility.

The control amount calculating unit 17 defines an evaluation function, and calculates the control amounts such that the evaluation function is minimized by quadratic programming, for example. The evaluation function is the sum of squares of the control amounts in respective sections, for example. The evaluation function may be a power transmission loss. For calculation of a control amount that minimizes the evaluation function, resolution of overload at each node, determination of the control amount within a controllable range of controllable charging and discharging facilities, and the like are set as constraint conditions.

For example, when a node at which voltage violation is determined to have occurred is present, the violation amount and the voltage sensitivities of controllable charging and discharging facilities are used for calculation of change amounts of charge and discharge amounts aggregated in units of sections. As described above, because the voltage sensitivity represents the amount of change in the voltage of each node when the aggregated charge and discharge amounts are changed by 1 kVar, the amount of change in the reactive power of aggregated charging and discharging facilities in each section for changing the voltage of a node at which voltage violation is determined to have occurred by the violation amount can be obtained as a control amount. For the method for determining the control amount, quadratic programming can be used, for example, in a manner similar to the case of overload.

After calculating the control amount, the control amount calculating unit 17 instructs the power flow calculating unit 15 to reflect the control amount and perform power flow calculation again. The power flow calculating unit 15 reflects the control amount and performs power flow calculation again. As described above, when the determination unit 16 has determined that at least one of voltage violation and overcurrent occurs, the power flow calculating unit 15 changes the charge and discharge amounts of the first charging and discharging facilities, performs power flow calculation again, and re-estimates the voltage and the current in the demand area power system.

After step S8, the determination unit 16 determines whether or not voltage violation or overload has occurred (step S9). In step S9, the determination unit 16 determines a result of power flow calculation performed again with the control amount reflected in step S8. When voltage violation or overload is determined to have occurred in step S9 (step S9: Yes), the capacity changing unit 18 calculates and records the capacities of the normal charging and discharging facilities (step S10).

Specifically, upon determining in step S9 that voltage violation or overload has occurred, the determination unit 16 informs the control amount calculating unit 17 of the determination result. As described above, the determination result includes information indicating the type of the violation, a node at which the violation has occurred, and a violation amount. The capacity changing unit 18 calculates the change amounts of the charging and discharging power for the normal charging and discharging facilities on the basis of the determination result provided from the determination unit 16. Note that the determination of the change amounts may be performed in units of aggregation described above or for each charging and discharging facility. For example, when a node at which overload is determined to have occurred is present, the capacity changing unit 18 calculates the change amounts of charge and discharge amounts aggregated in each section by using the violation amount and the current sensitivities of normal charging and discharging facilities. The capacity changing unit 18 can calculate the change amounts of charging and discharging power by quadratic programming or the like, for example, in a manner similar to the control amounts for controllable charging and discharging facilities. Similarly, when a node at which voltage violation is determined to have occurred is present, the capacity changing unit 18 calculates the change amounts of charging and discharging power aggregated in each section by using the violation amount and the voltage sensitivities of normal charging and discharging facilities. The capacity changing unit 18 can calculate the change amounts of charging and discharging power by quadratic programming or the like, for example, in a manner similar to the control amounts for controllable charging and discharging facilities. In the case of controllable charging and discharging facilities, the charge and discharge amounts can be controlled by the power system controlling device 3 in order to avoid voltage violation or overload; however, normal charging and discharging facilities cannot be controlled by the power system controlling device 3. Thus, when the charging and discharging power of normal charging and discharging facilities needs to be changed, the change is reflected as a change in maximum charging power and maximum discharging power, that is, a change in the capacity. For example, in a case where a charging and discharging facility having a capacity of a charging power of 50 kW is planned to be arranged in a facility plan, the capacity of the charging and discharging facility is changed to a charging power of 30 kW in step S10. Note that, regarding control amounts of controllable charging and discharging facilities, it may be considered that the facility plan evaluation device 1 controls existing controllable charging and discharging facilities, but regarding changes in the capacities of normal charging and discharging facilities, the facility plan evaluation device 1 changes the capacities of normal charging and discharging facilities to be newly arranged in accordance with a facility plan but does not change the capacities of existing normal charging and discharging facilities. The capacity changing unit 18 stores the capacities of the normal charging and discharging facilities reflecting the change as capacity information in the storage unit 19.

After the processes in steps S6 to S10 are performed for each time slot, the loop of patterns is repeated. Thus, the power flow calculating unit performs the first power flow calculation based on the first prediction information, and the second power flow calculation based on the second prediction information. After completion of the loop of patterns, the determination unit 16 determines whether or not control of the controllable charging and discharging facilities is necessary (step S11). Specifically, the determination unit 16 determines whether or not No has been determined in step S7 at least once in the processes in two patterns and in all the time slots. When No has not been determined in step S7 in the processes in two patterns and in all the time slots, the determination unit 16 determines that control of the controllable charging and discharging facilities is unnecessary. When voltage violation and overcurrent do not occur in both of an estimation result obtained by the first power flow calculation and an estimation result obtained by the second power flow calculation, the determination unit 16 determines that the facility plan need not be modified.

When control of controllable charging and discharging facilities is unnecessary (step S11: No), the determination unit 16 determines that the facility plan need not be modified, that is, need not be changed (step S12). When No is determined in step S11, this indicates that, when charging and discharging facilities are arranged in accordance with the facility plan input in step S1, voltage violation and overload do not occur even if control of the controllable charging and discharging facilities is not performed. The determination unit 16 therefore determines that the facility plan need not be modified, and outputs the determination result to the result presenting unit 20.

When control of controllable charging and discharging facilities is necessary (step S11: Yes), the determination unit 16 determines whether or not the capacity of a normal charging and discharging facility has been changed (step S13). Specifically, the determination unit 16 determines whether or not the capacity of a normal charging and discharging facility has been changed at least one in the processes in two patterns an in all the time slots. When the capacity of a normal charging and discharging facility has not been changed (step S13: No), the determination unit 16 determines that the facility plan need not be modified with some conditions (step S14). As described above, when voltage violation and overcurrent do not occur as a result of re-estimation performed by the power flow calculating unit 15, the determination unit 16 determines that the facility plan need not be modified. When No is determined in step S13, this indicates that, when charging and discharging facilities are arranged in accordance with the facility plan input in step S1, control of controllable charging and discharging facilities is necessary, but voltage violation and overload do not occur if the control is performed. The determination unit 16 therefore determines that the facility plan need not be modified with some conditions, and outputs the determination result to the result presenting unit 20.

When the capacity of a normal charging and discharging facility has been changed (step S13: Yes), modification of the facility plan is determined to be necessary, and a change amount of the capacity of the charging and discharging facility is calculated (step S15). Specifically, when at least one of voltage violation and overcurrent occurs as a result of re-estimation performed by the power flow calculating unit 15, the determination unit 16 determines that the facility plan needs to be modified.

More specifically, upon determining that the facility plan needs to be modified, the determination unit 16 informs the capacity changing unit 18 of the same. On the basis of the capacity information recorded in step S10, the capacity changing unit 18 obtains the capacity at which the change amount is largest among the recorded capacities in respective time slots as the change amount of the capacity of the normal charging and discharging facility, for each of the normal charging and discharging facilities the capacities of which have been changed. Specifically, when the determination unit 16 has determined that the facility plan needs to be modified, the capacity changing unit 18 calculates a change amount of the capacity of at least one of a plurality of charging and discharging facilities so that voltage violation and overcurrent will not occur. The determination unit 16 outputs a determination result indicating that the facility plan needs to be modified to the result presenting unit 20, and the capacity changing unit 18 outputs the change amount of a normal charging and discharging facility whose capacity needs to be changed to the result presenting unit 20. For example, in a case where the largest value (capacity) of the charging power in a facility plan of a normal charging and discharging facility planned to be arranged in the facility plan is 50 kW and the largest value of the change amounts of the charging power of the normal charging and discharging facility in each time slot is 20 kW, the change amount of the normal charging and discharging facility is 20 kW and the capacity thereof as a result of the change is 30 kW. Because the first pattern is a pattern in which the demand is largest and the power generation amount is smallest, voltage violation, if any, is likely to be violation in which the voltage is lower than the lower limit of the proper range. In a case where a node at which the voltage is lower than the lower limit of the proper range even if controllable charging and discharging facilities are controlled is present, the largest value of the charging power of a normal charging and discharging facility that is predicted to perform charging at the time is reduced, for example. In contrast, because the second pattern is a pattern in which the demand is smallest and the power generation amount is largest, voltage violation, if any, is likely to be violation in which the voltage exceeds the upper limit of the proper range. In a case where a node at which the voltage exceeds the upper limit of the proper range even if controllable charging and discharging facilities are controlled is present, the largest value of the discharging power of a normal charging and discharging facility that is predicted to perform discharging at the time is reduced, for example. In a case where the change amounts of capacities of charging and discharging facilities are calculated as capacity information in aggregation units, the change amounts calculated in aggregation units may be distributed to charging and discharging facilities after being calculated, or may be output to the result presenting unit 20.

After each of steps S12, S14, and S15, the result presenting unit 20 presents a determination result (step S16), and the evaluation process is terminated. The result presenting unit 20 may display the determination result or present the determination result to the user by transmitting the determination result to another device, for example. When No is determined in step S7 or when No is determined in step S9, the process proceeds to the next time loop or the next loop of patterns, and the processes from step S6 are repeated until the time loop and the loop of patterns are terminated.

As described above, the facility plan evaluation method of the present embodiment includes an inputting step of receiving, by the facility plan evaluation device 1, input of a facility plan, and a prediction step of predicting, by the facility plan evaluation device 1, charge and discharge amounts of a plurality of charging and discharging facilities and demands and power generation amounts of existing facilities. The facility plan evaluation method further includes a power flow calculation step of estimating, by the facility plan evaluation device 1, voltage and current in the demand area power system on the basis of a prediction result in the prediction step. The facility plan evaluation method further includes a determination step of determining, by the facility plan evaluation device 1, whether or not at least one of voltage violation and overcurrent occurs on the basis of an estimation result in the power flow calculation step, and determining, by the facility plan evaluation device 1, whether or not the facility plan needs to be modified on the basis of a result of the determination, and a presenting step of presenting, by the facility plan evaluation device 1, a determination result in the determination step.

FIGS. 9 to 11 are diagrams illustrating examples of determination results displayed by the result presenting unit 20 of the present embodiment. FIG. 9 illustrates an example of display of a determination result when No is determined in step S11 of FIG. 5, FIG. 10 illustrates an example of display of a determination result when No is determined in step S13, and FIG. 11 illustrates an example of display of a determination result when Yes is determined in step S13. In the examples illustrated in FIGS. 9 to 11, the result of evaluation of the facility plan is presented in three levels of A, B, and C, where A indicates that modification of the facility plan is unnecessary without any condition, B indicates that modification of the facility plan is unnecessary with some conditions, and C indicates that modification of the facility plan is necessary. In a case where the evaluation result is C, the result presenting unit 20 may display the change amount of the capacity of each normal charging and discharging facility whose capacity needs to be changed together with the determination result, that is, the evaluation result, as illustrated in FIG. 11. When the change amount is calculated in aggregation units, the result presenting unit 20 may also display the change amount in aggregation units. In this case, the user can take such measures as reducing the number of charging and discharging facilities to be arranged in sections in which the changes are needed or reducing the capacities of the charging and discharging facilities.

In the example described above, prediction curves of the largest and the smallest demands of the loads, prediction curves of the largest and the smallest power generation amounts of the power generation facilities, prediction curves of the largest charge amounts of the charging and discharging facilities, and prediction curves of the largest discharge amounts of the charging and discharging facilities are predicted on the basis of the metering data of the smart meters 21. The method for calculating the prediction curves is not limited to this example. For the charge amount and the discharge amount of each charging and discharging facility, the user may create a prediction curve of each of the charge amount and the discharge amount according to the type of the consumer having the charging and discharging facility or the like. In addition, in a case where a charging and discharging facility is a commercial charging and discharging facility and the charge amount is metered in a manner different from use of the smart meter 21, the facility plan evaluation device 1 may use the metered values to generate prediction curves of the respective cases of largest charge amounts and largest discharge amounts of the commercial charging and discharging facility planned to be arranged in a facility plan.

As described above, the facility plan evaluation device 1 of the present embodiment predicts a state of a power system in a case where a large number of charging and discharging facilities indicated in a facility plan including the locations of the charging and discharging facilities are arranged on the basis of the facility plan, and evaluates whether or not the facility plan needs to be modified on the basis of the prediction result. As a result, formulation of facility plans including the locations of a large number of charging and discharging facilities can be efficiently assisted. In addition, in a case where controllable charging and discharging facilities are present, the facility plan evaluation device 1 predicts a state of a power system on the assumption that the controllable charging and discharging facilities are controlled, and determines that a facility plan need not be modified when voltage violation and overload will not occur as a result of controlling the controllable charging and discharging facilities. As a result, the power system can be stabilized by making use of arrangement plans indicated by facility plans as much as possible. In addition, when it is predicted that voltage violation or overload will still occur even if controllable charging and discharging facilities are controlled, the facility plan evaluation device 1 calculates capacities of the charging and discharging facilities with which voltage violation and overload will not occur, and presents the calculated capacities to the user. As a result, the user can efficiently modify a facility plan.

The configurations presented in the embodiment above are examples of the present invention, and can be combined with other known technologies or can be partly omitted or modified without departing from the scope of the present invention.

REFERENCE SIGNS LIST

1 facility plan evaluation device; 2 metering data collection system; 3 power system controlling device; 4, 7-1 to 7-4 voltage transformer; 5, 6 LRT; 8-1 to 8-4, 80-1 to 80-9 charging and discharging facility; 9-1 to 9-10 load; 10-1 to 10-4 power generation facility; 11 data collecting unit; 12 proposed plan receiving unit; 13 prediction unit; 14 sensitivity calculating unit; 15 power flow calculating unit; 16 determination unit; 17 control amount calculating unit; 18 capacity changing unit; 19 storage unit; 20 result presenting unit; 21-1 to 21-5 smart meter; 30 communication network; 41 power line; 51-1, 51-2, 61-1, 61-2 distribution line.

The invention claimed is:

1. A facility plan evaluation device comprising:
   an input receiver to receive input of a facility plan including capacities and locations of a plurality of charging and discharging facilities to be newly arranged in a power system;
   prediction circuitry to predict charge and discharge amounts of the charging and discharging facilities, and demands and power generation amounts of existing facilities, the existing facilities being facilities already connected in the power system;
   a power flow calculator to estimate voltage and current in the power system by power flow calculation on the basis of a prediction result of the prediction circuitry;
   determination circuitry to determine whether or not at least one of deviation of voltage from a proper range and overcurrent occurs in the power system on the basis of an estimation result of the power flow calculator, and determine whether or not the facility plan needs to be modified on the basis of a determination result;
   communication circuitry to send commands to at least one of the plurality of charging and discharging facilities for adjusting operating parameters based on the determination result; and
   result presenting circuitry to present a determination result of the determination circuitry,
   wherein the charging and discharging facilities include a first charging and discharging facility for which charge and discharge amounts are controllable, and second charging and discharging facilities being the charging and discharging facilities other than the first charging and discharging facility,
   when the determination circuitry determines that at least one of the deviation of voltage from the proper range and the overcurrent occurs in the power system, the power flow calculator changes charge and discharge amounts in the operating parameters of the first charging and discharging facility, and performs power flow calculation again to re-estimate the voltage and the current in the power system, and
   when the deviation of voltage from the proper range does not occur and the overcurrent does not occur in the power system as a result of re-estimation of the power flow calculator, the determination circuitry determines that the facility plan need not be modified.

2. The facility plan evaluation device according to claim 1, wherein when at least one of the deviation of voltage from the proper range and the overcurrent occurs in the power system as a result of re-estimation of the power flow calculator, the determination circuitry determines that the facility plan needs to be modified.

3. The facility plan evaluation device according to claim 2, wherein
   when the determination circuitry determines that the facility plan needs to be modified, a change amount of a capacity of at least one of the charging and discharging facilities is calculated such that the deviation of voltage from the proper range and the overcurrent do not occur in the power system, and
   when the determination circuitry determines that the facility plan needs to be modified, the result presenting circuitry presents the change amount together with a determination result.

4. The facility plan evaluation device according to claim 1, wherein
   the prediction circuitry calculates, as first prediction information, prediction values of largest values of charge amounts of the charging and discharging facilities, prediction values of largest values of demands of the existing facilities, and prediction values of smallest values of power generation amounts of the existing facilities in respective time zones, and calculates, as second prediction information, prediction values of largest values of discharge amounts of the charging and discharging facilities, prediction values of smallest values of demands of the existing facilities, and prediction values of largest values of power generation amounts of the existing facilities in the respective time zones, the power flow calculator performs first power flow calculation based on the first prediction information, and second power flow calculation based on the second prediction information, and the determination circuitry determines that the facility plan need not be modified when the deviation of voltage from the proper range and the overcurrent do not occur in the power system in both of an estimation result obtained by the first power flow calculation and an estimation result obtained by the second power flow calculation.

5. The facility plan evaluation device according to claim 1, wherein the prediction circuitry predicts the charge and discharge amounts of the charging and discharging facilities and demands and power generation amounts of existing facilities on the basis of metering data of a smart meter included in an automatic meter reading system, the existing facilities being facilities already connected in the power system.

6. A facility plan evaluation method comprising:
receiving, by a computing system, input of a facility plan including capacities and locations of a plurality of charging and discharging facilities to be newly arranged in a power system;
predicting, by the computing system, charge and discharge amounts of the charging and discharging facilities, and demands and power generation amounts of existing facilities, the existing facilities being facilities already connected in the power system;
estimating, by the computing system, voltage and current in the power system on the basis of a prediction result in the predicting;
determining, by the computing system, whether or not at least one of deviation of voltage from a proper range and overcurrent occurs in the power system on the basis of an estimation result in the estimating, and determining whether or not the facility plan needs to be modified on the basis of a determination result;
sending, by the computing system, commands to at least one of the plurality of charging and discharging facilities for adjusting operating parameters based on the determination result; and
presenting, by the computing system, a determination result in the determination,
wherein the charging and discharging facilities include a first charging and discharging facility for which charge and discharge amounts are controllable, and second charging and discharging facilities being the charging and discharging facilities other than the first charging and discharging facility,
when the determining determines that at least one of the deviation of voltage from the proper range and the overcurrent occurs in the power system, the estimating changes charge and discharge amounts of the first charging and discharging facility, and performs estimation again to re-estimate the voltage and the current in the power system, and
when the deviation of voltage from the proper range does not occur and the overcurrent does not occur in the power system as a result of re-estimation, the determining determines that the facility plan need not be modified.

7. The facility plan evaluation device according to claim 2, wherein
the prediction circuitry calculates, as first prediction information, prediction values of largest values of charge amounts of the charging and discharging facilities, prediction values of largest values of demands of the existing facilities, and prediction values of smallest values of power generation amounts of the existing facilities in respective time zones, and calculates, as second prediction information, prediction values of largest values of discharge amounts of the charging and discharging facilities, prediction values of smallest values of demands of the existing facilities, and prediction values of largest values of power generation amounts of the existing facilities in the respective time zones,
the power flow calculator performs first power flow calculation based on the first prediction information, and second power flow calculation based on the second prediction information, and
the determination circuitry determines that the facility plan need not be modified when the deviation of voltage from the proper range and the overcurrent do not occur in the power system in both of an estimation result obtained by the first power flow calculation and an estimation result obtained by the second power flow calculation.

8. The facility plan evaluation device according to claim 3, wherein
the prediction circuitry calculates, as first prediction information, prediction values of largest values of charge amounts of the charging and discharging facilities, prediction values of largest values of demands of the existing facilities, and prediction values of smallest values of power generation amounts of the existing facilities in respective time zones, and calculates, as second prediction information, prediction values of largest values of discharge amounts of the charging and discharging facilities, prediction values of smallest values of demands of the existing facilities, and prediction values of largest values of power generation amounts of the existing facilities in the respective time zones,
the power flow calculator performs first power flow calculation based on the first prediction information, and second power flow calculation based on the second prediction information, and
the determination circuitry determines that the facility plan need not be modified when the deviation of voltage from the proper range and the overcurrent do not occur in the power system in both of an estimation result obtained by the first power flow calculation and an estimation result obtained by the second power flow calculation.

9. The facility plan evaluation device according to claim 2, wherein the prediction circuitry predicts the charge and discharge amounts of the charging and discharging facilities and demands and power generation amounts of existing facilities on the basis of metering data of a smart meter included in an automatic meter reading system, the existing facilities being facilities already connected in the power system.

10. The facility plan evaluation device according to claim 3, wherein the prediction circuitry predicts the charge and discharge amounts of the charging and discharging facilities and demands and power generation amounts of existing facilities on the basis of metering data of a smart meter included in an automatic meter reading system, the existing facilities being facilities already connected in the power system.

11. The facility plan evaluation device according to claim 4, wherein the prediction circuitry predicts the charge and discharge amounts of the charging and discharging facilities and demands and power generation amounts of existing facilities on the basis of metering data of a smart meter included in an automatic meter reading system, the existing facilities being facilities already connected in the power system.

12. The facility plan evaluation device according to claim 7, wherein the prediction circuitry predicts the charge and discharge amounts of the charging and discharging facilities and demands and power generation amounts of existing facilities on the basis of metering data of a smart meter included in an automatic meter reading system, the existing facilities being facilities already connected in the power system.

13. The facility plan evaluation device according to claim 8, wherein the prediction circuitry predicts the charge and discharge amounts of the charging and discharging facilities and demands and power generation amounts of existing facilities on the basis of metering data of a smart meter included in an automatic meter reading system, the existing facilities being facilities already connected in the power system.

* * * * *